(12) United States Patent
Ura et al.

(10) Patent No.: US 11,996,339 B2
(45) Date of Patent: May 28, 2024

(54) ELECTRONIC ELEMENT MOUNTING SUBSTRATE, AND ELECTRONIC DEVICE

(71) Applicant: KYOCERA Corporation, Kyoto (JP)

(72) Inventors: Kenichi Ura, Kyoto (JP); Madoka Kato, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 254 days.

(21) Appl. No.: 17/297,058

(22) PCT Filed: Nov. 27, 2019

(86) PCT No.: PCT/JP2019/046377
§ 371 (c)(1),
(2) Date: May 26, 2021

(87) PCT Pub. No.: WO2020/111125
PCT Pub. Date: Jun. 4, 2020

(65) Prior Publication Data
US 2021/0407872 A1    Dec. 30, 2021

(30) Foreign Application Priority Data

Nov. 28, 2018  (JP) ................................. 2018-222619

(51) Int. Cl.
    *H01L 23/13*    (2006.01)
    *H01L 23/498*   (2006.01)
    *H01L 23/00*    (2006.01)
    *H01L 23/20*    (2006.01)

(52) U.S. Cl.
    CPC ........ *H01L 23/13* (2013.01); *H01L 23/49822* (2013.01); *H01L 23/20* (2013.01); *H01L 24/48* (2013.01); *H01L 24/49* (2013.01); *H01L 2224/48227* (2013.01); *H01L 2224/49176* (2013.01); *H01L 2924/15151* (2013.01); *H01L 2924/15153* (2013.01); *H01L 2924/17151* (2013.01)

(58) Field of Classification Search
None
See application file for complete search history.

(56) References Cited

U.S. PATENT DOCUMENTS

| | | | |
|---|---|---|---|
| 9,954,143 B2* | 4/2018 | Tanuma | H01L 33/62 |
| 2004/0201987 A1* | 10/2004 | Omata | H01L 33/486 |
| | | | 362/800 |
| 2014/0084322 A1* | 3/2014 | Park | H01L 33/486 |
| | | | 257/98 |
| 2022/0077012 A1* | 3/2022 | Kukita | H01L 23/12 |

FOREIGN PATENT DOCUMENTS

| | | |
|---|---|---|
| JP | 2004-119881 A | 4/2004 |
| JP | 2007-128987 A | 5/2007 |
| JP | 2014-030155 A | 2/2014 |
| JP | 2017-169164 A | 9/2017 |

* cited by examiner

*Primary Examiner* — Cory W Eskridge
(74) *Attorney, Agent, or Firm* — Volpe Koenig

(57) ABSTRACT

An electronic element mounting substrate includes a substrate including, on a first upper surface, a mounting region in which an electronic element is mounted, a frame body located on the first upper surface of the substrate and surrounding the mounting region, a channel extending through the frame body outward from an inner wall of the frame body, and an electrode pad located on the first upper surface of the substrate or an inner surface of the frame body. The channel is located above or below the electrode pad.

20 Claims, 16 Drawing Sheets

FIG. 1A
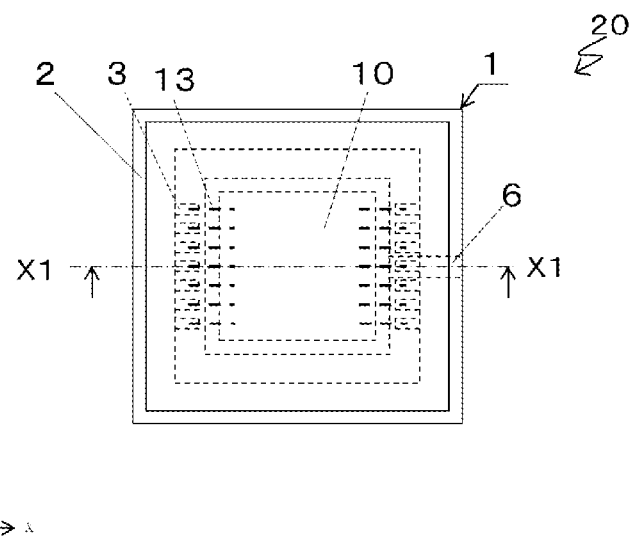
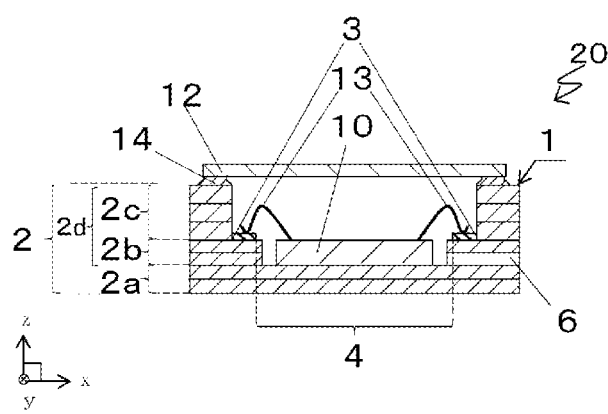
FIG. 1B

FIG. 2A
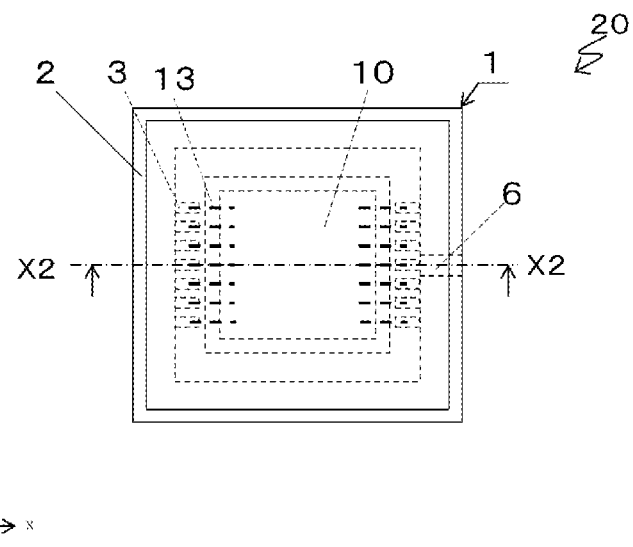
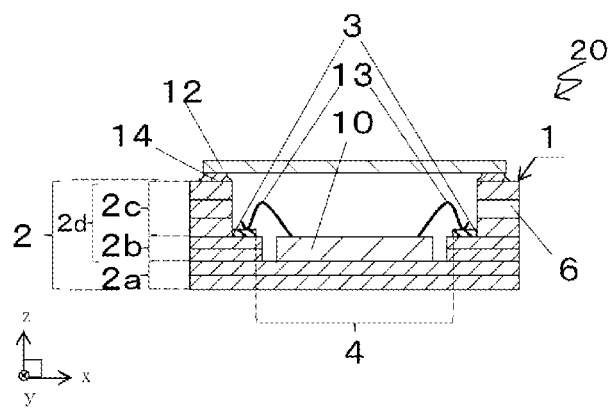
FIG. 2B

FIG. 3A
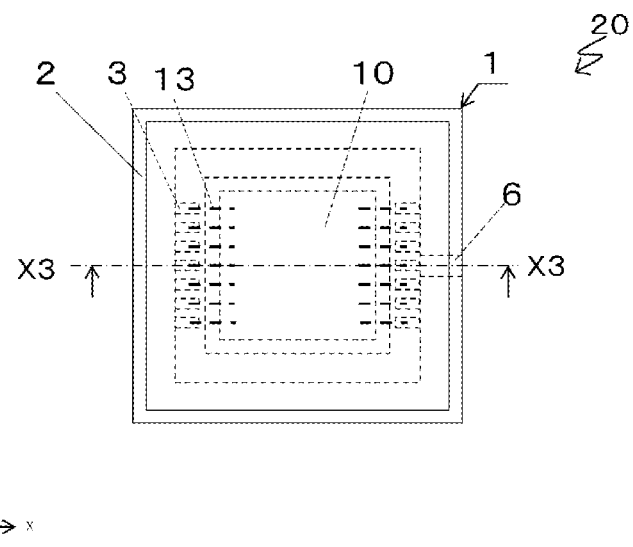
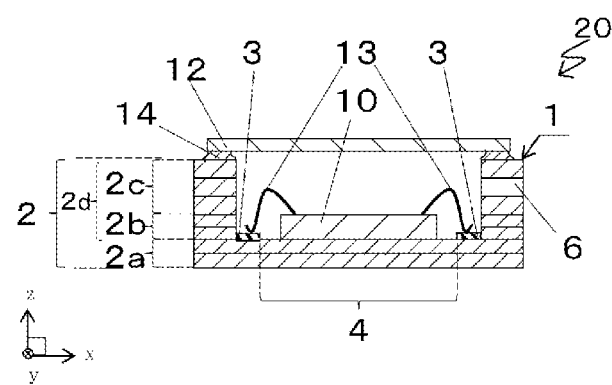
FIG. 3B

FIG. 7A
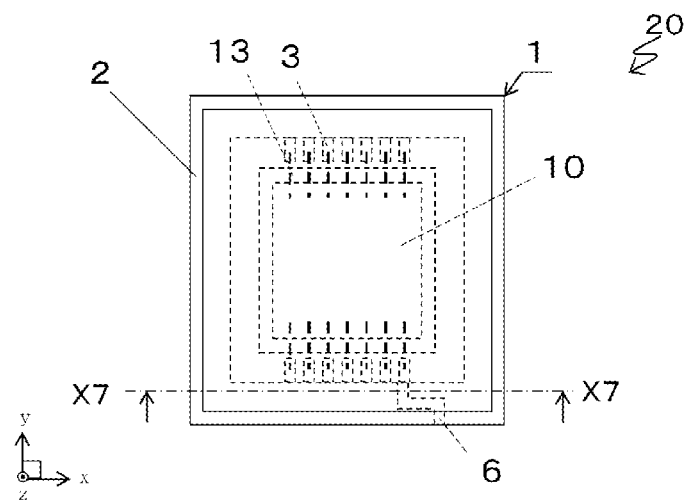
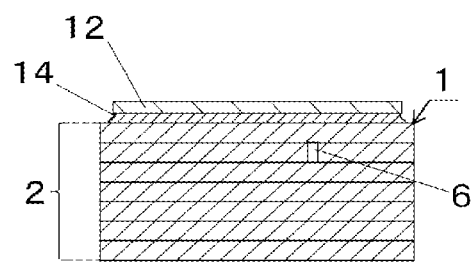
FIG. 7B

FIG. 8A
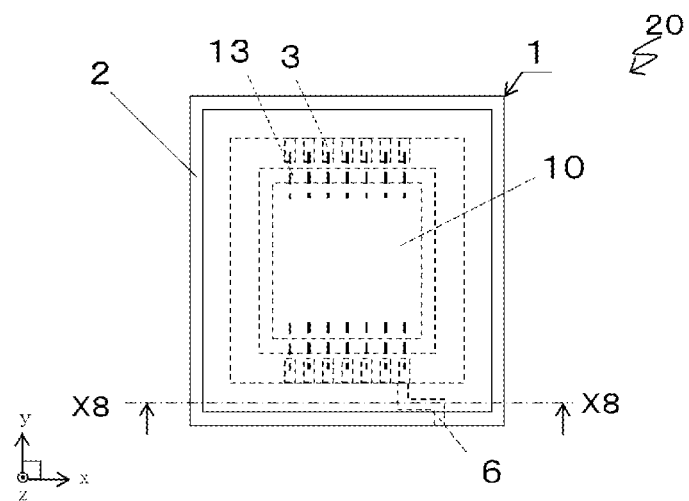
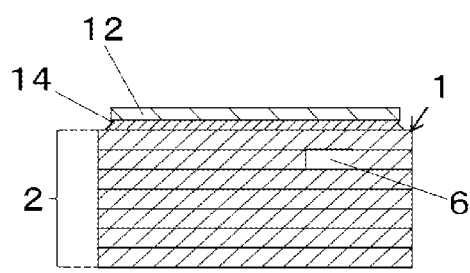
FIG. 8B

ELECTRONIC ELEMENT MOUNTING SUBSTRATE, AND ELECTRONIC DEVICE

TECHNICAL FIELD

The present disclosure relates to an electronic element mounting substrate on which an electronic element or other components are mounted, an electronic device, and an electronic module.

BACKGROUND ART

A known electronic element mounting substrate includes a substrate having an insulating layer and a wiring layer, and including a recessed portion. In addition, such an electronic element mounting substrate is known to have a structure including a channel through which the recessed portion communicates with the outside. (See Japanese application publication No. 2007-128987).

After manufacture of an electronic device in which an electronic element is mounted in the recessed portion of the electronic element mounting substrate and sealed with a lid or the like, air injection/discharge may be performed from the channel in order to replace the air inside the electronic device with an appropriately selected base such as nitrogen. In recent years, the terminals of electronic elements have become progressively finer, and the diameters of wires used to electrically connect an electronic element and an electronic element mounting substrate to each other have also become smaller. Therefore, there has been a concern that the force of air in the step of air injection/discharge using the channel of the electronic device may bend the wires, causing a short circuit between adjacent wires. In addition, there has been a concern that the bonding strength between the wires and electrode pads of the electronic element mounting substrate may deteriorate due to pressure of the air in the step of air injection/discharge.

In addition to the case where air injection/discharge is performed through the channel, there is a case where only air discharge is performed through the channel such that water vapor or the like does not accumulate inside the electronic device (air injection/discharge is not intentionally performed) in the step of bonding the lid or the like at the time of producing the electronic device. In this step, since air is not intentionally discharged, if the height position of the channel inner wall is the same as or near the height position of the electrodes, for example, dust or the like enters from the channel, and the next step is reached while the dust remains located near the electrodes. Thereafter, in a case where the electronic device is mounted on an external device and then vibration or the like is applied to the electronic device from the outside, there is a concern that dust located near the electrodes may move and cause a short circuit between the electrodes, thereby causing a malfunction.

SUMMARY

An electronic element mounting substrate according to an aspect of the present disclosure includes a substrate including, on a first upper surface, a mounting region in which an electronic element is to be mounted; a frame body located on the first upper surface of the substrate and surrounding the mounting region; a channel extending through the frame body outward from an inner wall of the frame body; and an electrode pad located on the first upper surface of the substrate or an inner surface of the frame body, in which the channel is located above or below the electrode pad.

An electronic device according to another aspect of the present disclosure includes an electronic element mounting substrate including a substrate including, on a first upper surface, a mounting region in which an electronic element is to be mounted, a frame body located on the first upper surface of the substrate and surrounding the mounting region, and an electrode pad located on the first upper surface of the substrate or an inner surface of the frame body; and an electronic element mounted in the mounting region and electrically connected to the electrode pad via a connection conductor, in which the electronic element mounting substrate includes a channel extending through the electronic element mounting substrate outward from an inner wall that does not overlap the connection conductor in a side view.

BRIEF DESCRIPTION OF DRAWINGS

FIG. 1A is a top view illustrating the outer appearance of an electronic element mounting substrate and an electronic device according to a first embodiment of the present disclosure, and FIG. 1B is a vertical cross-sectional view corresponding to the line X1-X1 in FIG. 1A.

FIG. 2A is a top view illustrating the outer appearance of an electronic element mounting substrate and an electronic device according to a second embodiment of the present disclosure, and FIG. 2B is a vertical cross-sectional view corresponding to the line X2-X2 in FIG. 2A.

FIG. 3A is a top view illustrating the outer appearance of an electronic element mounting substrate and an electronic device according to another aspect of the second embodiment of the present disclosure, and FIG. 3B is a vertical cross-sectional view corresponding to the line X3-X3 in FIG. 3A.

FIG. 7A is a top view illustrating the outer appearance of an electronic element mounting substrate and an electronic device according to another aspect of the fourth embodiment of the present disclosure, and FIG. 7B is a vertical cross-sectional view corresponding to the line X7-X7 in FIG. 7A.

FIG. 8A is a top view illustrating the outer appearance of an electronic element mounting substrate and an electronic device according to another aspect of the fourth embodiment of the present disclosure, and FIG. 8B is a vertical cross-sectional view corresponding to the line X8-X8 in FIG. 8A.

DESCRIPTION OF EMBODIMENTS

Figure 4A:
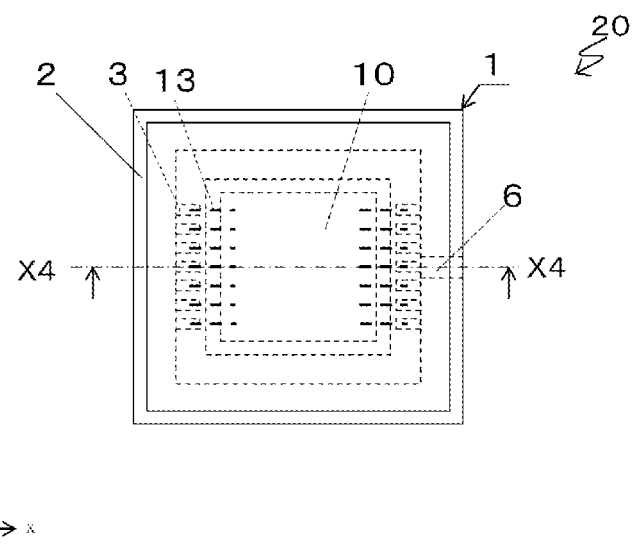
FIG. 4A is a top view illustrating the outer appearance of an electronic element mounting substrate and an electronic device according to an aspect of a third embodiment of the present disclosure.

Configuration of Electronic Element Mounting Substrate and Electronic Device

Several exemplary embodiments of the present disclosure will be described hereinafter with reference to the drawings. In the following, a configuration in which an electronic element is mounted on an electronic element mounting substrate is defined as an electronic device. In addition, a configuration having a casing or a member provided on an upper surface side of the electronic element mounting substrate or surrounding the electronic device is defined as an electronic module. With respect to the electronic element mounting substrate, the electronic device, and the electronic module, any direction may be defined as upward or downward, but for the sake of simplicity, the Cartesian coordinate system XYZ will be used herein, with a positive side in the Z direction defined as upward. Here, the electronic element refers to, for example, an imaging element such as one of a charge coupled device (CCD) type or a complementary metal oxide semiconductor (CMOS) type, a light emitting element such as a light emitting diode (LED), an element having a sensing function such as a pressure sensor, atmospheric pressure sensor, acceleration sensor, or gyro sensor, or an integrated circuit.

First Embodiment

An electronic element mounting substrate 1 and an electronic device 20 provided with the electronic element mounting substrate 1 according to a first embodiment of the present disclosure will be described with reference to FIG. 1. Note that, in the present embodiment, the electronic device 20 is illustrated in FIG. 1.

The electronic element mounting substrate 1 includes a substrate 2a having a mounting region 4 in which an electronic element 10 is mounted on a first upper surface 20a. The electronic element mounting substrate 1 includes a frame body 2d located on a first upper surface 21 of the substrate 2a so as to surround the mounting region 4. The electronic element mounting substrate 1 includes a channel 6 extending through the frame body 2d outward from an inner wall of the frame body 2d. Electrode pads 3 are located on the first upper surface 20a of the substrate 2a or on an inner surface of the frame body. The channel 6 is located above or below the electrode pads 3. Note that the frame body 2d may include a first frame body 2b and a second frame body 2c, the inner wall of the frame body 2d may include a step, and the first frame body 2b and the second frame body 2c can be formed with the step as a boundary. As the step, the first frame body 2b may protrude further inward than the second frame body 2c, and the electrode pads 3 may be located on a second upper surface 22 that is an upper surface of the first frame body 2b.

Here, the mounting region 4 is a region in which at least one of the electronic elements 10 is mounted, and can be appropriately defined as, for example, a region inside the outermost periphery of the electrode pads 3 to be described later, a region in which a lid is to be mounted, or as another larger region. In addition, the components mounted in the mounting region 4 are not limited to the electronic elements 10 and may be, for example, electronic components, and the quantity of the electronic elements 10 and/or electronic components is not specified.

Hereinafter, the combination of the substrate 2a, the first frame body 2b, and the second frame body 2c is referred to as a base body 2.

In the example illustrated in FIG. 1, the base body 2 formed by the substrate 2a and the frame body 2d (first frame body 2b and second frame body 2c) is constituted by a plurality of insulating layers; however, the base body 2 may be formed by a mold or the like, may be formed by pressure molding with a metal mold or the like, or may have a configuration of only one layer. Examples of the material of the insulating layers forming the base body 2 include an electrically insulating ceramic and a resin.

Examples of the electrically insulating ceramic used as the material of the insulating layers forming the base body 2 include an aluminum oxide sintered body, a mullite sintered body, a silicon carbide sintered body, an aluminum nitride sintered body, a silicon nitride sintered body, and a glass ceramic sintered body. Examples of the resin used as the material of the insulating layers forming the base body 2 include a thermoplastic resin, an epoxy resin, a polyimide resin, an acrylic resin, a phenol resin, and a fluorine-based resin. Examples of the fluorine-based resin include an ethylene tetrafluoride resin.

The base body 2 may be formed of seven insulating layers as illustrated in FIG. 1, or may be formed of six or less or eight or more insulating layers. When the number of insulating layers is six or less, the thickness of the electronic element mounting substrate 1 can be reduced. When the number of insulating layers is eight or more, the rigidity of the electronic element mounting substrate 1 can be increased.

For example, one side of an outermost periphery of the electronic element mounting substrate 1 may have a size from 0.3 mm to 10 cm, and when the electronic element mounting substrate 1 has a quadrilateral shape in a plan view, the shape may be square or rectangular. In addition, for example, the thickness of the electronic element mounting substrate 1 may be 0.2 mm or greater.

The electronic element mounting substrate 1 includes the electrode pads 3 located on an inner surface of the frame body 2d (the second upper surface 22 of the first frame body 2b or the second frame body 2c). Here, the electrode pads 3 refer to pads that are electrically connected to the electronic element 10, for example.

In addition, external circuit connection electrodes may be provided on an upper surface, a side surface, or a lower surface of the base body 2 of the electronic element mounting substrate 1. The external circuit connection electrodes may electrically connect the base body 2 to an external circuit board, or connect the electronic device 20 to the external circuit board.

Furthermore, in addition to the electrode pads 3 and/or the external circuit connection electrodes, electrodes formed between insulating layers, internal wiring electrical conductors, and through conductors vertically connecting the internal wiring electrical conductors to each other may be provided on the upper surface or lower surface of the base body 2. These electrodes, internal wiring electrical conductors or through conductors may be exposed on the surface of the base body 2. The electrode pads 3 and/or the external circuit connection electrodes may be individually electrically connected by the electrodes, internal wiring electrical conductors or through conductors.

When the base body 2 is formed of an electrically insulating ceramic, the electrode pads 3, external circuit connection electrodes, internal wiring electrical conductors and/or through conductors are formed of tungsten (W), molybdenum (Mo), manganese (Mn), palladium (Pd), silver (Ag), or copper (Cu), or an alloy containing at least one metal material selected from the aforementioned. In addition, the electrode pads 3, external circuit connection electrodes, internal wiring electrical conductors and/or through conductors may be solely formed of copper (Cu). In addition, when the plurality of layers are formed of a resin, the electrode pads 3, external circuit connection electrodes, internal wiring electrical conductors and/or through conductors are formed of copper (Cu), gold (Au), aluminum (Al), nickel (Ni), molybdenum (Mo), palladium (Pd), or titanium (Ti), or an alloy containing at least one metal material selected from the aforementioned.

A plating layer may be further provided on the exposed surfaces of the electrode pads 3, external circuit connection electrodes, internal wiring electrical conductors, and/or through conductors. This configuration can protect the exposed surfaces of the electrodes, conductor layers and through conductors used for connecting to an external circuit and inhibit oxidation. In addition, this configuration allows the electrode pads 3 and the electronic element 10 to be satisfactorily electrically connected via connection conductors 13 such as wires. The plating layer may be formed by depositing a nickel (Ni) plating layer having a thickness from 0.5 μm to 10 μm, or by successively depositing the Ni plating layer and a gold (Au) plating layer having a thickness from 0.5 μm to 3 μm.

The first frame body 2b of the electronic element mounting substrate 1 includes, between the substrate 2a and the first frame body 2b, the channel 6 extending through the first frame body 2b outward from an inner wall of the first frame body.

After manufacture of an electronic device in which an electronic element is mounted in the recessed portion of the electronic element mounting substrate and sealed with a lid or the like, air injection/discharge may be performed from the channel in order to replace the air inside the electronic device with an appropriately selected base such as nitrogen. In recent years, the terminals of electronic elements have become progressively finer, and the diameters of wires used to electrically connect an electronic element and an electronic element mounting substrate to each other have also become smaller. Therefore, there has been a concern that the force of air in the step of air injection/discharge using the channel of the electronic device may bend the wires, causing a short circuit between adjacent wires. In addition, there has been a concern that the bonding strength between the wires and the electrode pads of the electronic element mounting substrate may deteriorate due to pressure of the air in the step of air injection/discharge.

In contrast, in the present embodiment, the electronic element mounting substrate 1 includes, between the substrate 2a and the first frame body 2b, the channel 6 extending through the first frame body 2b outward from the inner wall of the first frame body 2b. In other words, one end of an opening portion of the channel 6 is located below the electrode pads 3 in a cross-sectional view. Consequently, in the step of air injection/discharge using the channel 6, it is possible to reduce the impingement of air directly on the wires 13. Therefore, it is possible to reduce bending of the wires 13 due to the force of air and reduce the occurrence of a short circuit between adjacent wires. Therefore, it is possible to reduce a decrease in the yield of the electronic device 20.

In addition to the case where air injection/discharge is performed through the channel, there is a case where only air discharge is performed through the channel such that water vapor or the like does not accumulate inside the electronic device (air injection/discharge is not intentionally performed) in the step of bonding the lid or the like at the time of producing the electronic device. In this step, because air is not intentionally discharged, for example, when the channel is in the same location as or near the electrodes and dust or the like has entered from the channel, the next step will be reached while the dust remains located near the electrodes. Thereafter, in a case where the electronic device is mounted on an external device and then vibration or the like is applied to the electronic device from the outside, there is a concern that dust located near the electrodes may move and cause a short circuit between the electrodes, thereby causing a malfunction.

On the other hand, in the present embodiment, since one end of the opening portion of the channel 6 is located below the electrode pads 3 in a cross-sectional view, dust that has entered from the channel 6 is less likely to adhere near the electrode pads 3. Thus, even when the electronic device 20 is subjected to vibration from the outside, it is possible to reduce the likelihood of dust adhering between a plurality of the electrode pads 3 and causing a short circuit between the plurality of electrode pads 3. Therefore, it is possible to reduce the likelihood of malfunction of the electronic device 20.

In the electronic element mounting substrate 1, the electrode pads 3 are located further inward than the second frame body 2c, and the mounting region 4 is located further inward than the electrode pads 3. In other words, in the electronic element mounting substrate 1, the electrode pads 3 and the electronic element 10 mounted in the mounting region 4 do not overlap each other in a top surface view, and, furthermore, the electrode pads 3 are located on the second upper surface 22 of the first frame body 2b. Consequently, it is possible to position an end portion of the channel 6 below the electrode pads 3 and, in a top surface view, further inward than end portions of the electrode pads 3. Therefore, it is possible to further improve the effect of the present embodiment. In addition, since the electrode pads 3 are located on the second upper surface 22 of the first frame body 2b, the position of the upper surface of the electronic element 10 mounted on the mounting region 4 and the positions of the electrode pads 3 in a cross-sectional view can be set to the same height position. Therefore, the length of the wires 13 can be shortened. Consequently, it possible to improve the electrical characteristics. Furthermore, since the length of the wires 13 is short, it is possible to reduce the amount of bending of the wires 13 in the step of air injection/discharge using the channel 6. Therefore, it is possible to reduce contact between the wires 13 of adjacent electrode pads 3 and to improve the effect of the present embodiment.

The first frame body 2b and the second frame body 2c may be positioned so as to overlap in a top surface view, and the inner edge of the frame of the first frame body 2b or the second frame body 2c may be located further inward than the inner edge of the second frame body 2c or the first frame body 2b in a top surface view, respectively. In any such case, since the electrode pads 3 are located on or above the second upper surface 22 of the first frame body 2b, and the end portion of the channel 6 is located between the second upper surface 22 of the first frame body 2b and the substrate 2a, the effects of the present embodiment can be achieved.

The first frame body 2b of the electronic element mounting substrate 1 has a plurality of layers, and the thickness of the channel 6 in a cross-sectional view may be at least that of one layer of the plurality of layers. Consequently, air can be injected/discharged more smoothly. Therefore, since it is possible to perform air injection/discharge without increasing output, it is possible to reduce the amount of bending of the wires 13, and, in addition, it is possible to reduce the likelihood of contamination by dust.

Configuration of Electronic Device

An example of the electronic device 20 is illustrated in FIG. 1. The electronic device 20 includes the electronic element mounting substrate 1 and the electronic element 10 mounted on the upper surface of the electronic element mounting substrate 1.

The electronic device 20 includes the electronic element mounting substrate 1 and the electronic element 10 mounted in the mounting region 4 of the substrate 2a of the electronic element mounting substrate 1. Here, the electronic element 10 refers to, for example, an imaging element such as one of a charge coupled device (CCD) type or a complementary metal oxide semiconductor (CMOS) type, a light emitting element such as a light emitting diode (LED), an element having a sensing function such as a pressure sensor, atmospheric pressure sensor, acceleration sensor, or gyro sensor, or an integrated circuit. Note that the electronic element 10 may be disposed on the first upper surface 21 of the substrate 2a by using an adhesive material. Examples of the adhesive material include a silver epoxy and a thermosetting resin.

The electronic element 10 and the electronic element mounting substrate 1 may be electrically connected, for example, by the wires 13.

The electronic device 20 may include a lid 12 bonded to the upper surface of the electronic element mounting substrate 1 and covering the electronic element 10.

In a case where the electronic element 10 is an imaging element such as a CMOS or CCD, or a light emitting element such as an LED, for example, a material having a high transparency such as a glass material may be used for the lid. In addition, in a case where the electronic element 10 is an integrated circuit or the like, for example, a metal material, a ceramic material, or an organic material may be used for the lid.

The lid may be bonded to the electronic element mounting substrate 1 via a lid bonding member 14. Examples of the material constituting the lid bonding member 14 include a brazing material composed of a thermosetting resin, a low-melting-point glass, or a metal component.

Here, after the step of air injection/discharge or bonding of the lid 12 has been completed, the channel 6 may be filled with a resin or the like at an end portion of the channel 6 located on the outside. Consequently, it is possible to reduce contamination by dust from the channel after the step of air injection/discharge or bonding of the lid 12 has been completed. At this time, applying a metal layer to an inner wall of the channel 6 makes it possible to perform sealing by using, for example, a brazing material.

In addition, the channel 6 may also be opened after the step of producing the electronic device 20. With this configuration, at the stage where the electronic device 20 is connected to an external device and actually used by a user, it is possible to adjust an amount of water inside the electronic device 20 caused by, for example, fluctuations in atmospheric pressure or temperature.

With the electronic device 20 having the electronic element mounting substrate 1 as illustrated in FIG. 1, in the step of air injection/discharge in the channel 6, it is possible to reduce the likelihood of adjacent wires 13 coming into contact with each other and causing a short circuit. As a result, the yield of the electronic device 20 can be reduced. In addition, it is possible to reduce the likelihood of dust, which has entered from the channel 6, being located between a plurality of the electrode pads 3 and causing a short circuit, and, consequently, it is possible to reduce the likelihood of malfunction of the electronic device 20.

Configuration of Electronic Module

The electronic element mounting substrate 1 and the electronic device 20 according to the present embodiment may constitute an electronic module 31 including the electronic device 20 and a casing 32 located on an upper surface of the electronic device 20 or on the electronic device 20. Note that, in the examples described below, an imaging module is described as an example. Here, as to the casing 32 located on the upper surface of the electronic device 20, a case where the electronic device 20 itself is covered by the casing 32 is included in the present configuration because a portion of the casing 32 is located on the electronic device 20.

The electronic module 31 may include the casing 32 (e.g., a lens holder). The inclusion of the casing 32 makes it possible to further improve airtightness or reduce the direct application of stress from the outside to the electronic device 20. The casing 32 is made of, for example, a resin or a metal material. When the casing 32 is a lens holder, one or more lenses made of a resin, a liquid, a glass, a crystal, or the like may be incorporated into the casing 32. In addition, the casing 32 may be equipped with a drive device or the like configured to drive up, down, left, and right, and may be electrically connected to a pad or the like located on the surface of the electronic element mounting substrate 1 by using a bonding material such as solder.

Note that the casing 32, when viewed from directly above, may be provided with an opening portion on at least one side in any of four directions or on the lower surface side. Further, an external circuit board may be inserted through the opening portion of the casing 32 and electrically connected to the electronic element mounting substrate 1. In addition, after the external circuit board has been electrically connected to the electronic element mounting substrate 1, the opening portion of the casing 32 may be sealed with a sealing material such as a resin or the like, such that the inside of the electronic module 31 may be hermetically sealed.

Since the electronic module 31 includes the electronic element mounting substrate 1, it is possible to reduce the likelihood of the electronic device 20 vibrating and causing malfunction due to the movement of dust, and, consequently, it is possible to reduce the likelihood of malfunction when the electronic module 31 operates.

Manufacturing Method for Electronic Element Mounting Substrate and Electronic Device Next, an example of a manufacturing method for the electronic element mounting substrate 1 and the electronic device 20 according to the present embodiment will be described. The example of the manufacturing method illustrated below is a manufacturing method for the base body 2 using a multipiece wiring board.

(1) First, ceramic green sheets constituting the base body 2 (substrate 2a, first frame body 2b, and second frame body 2c) are formed. For example, in order to obtain a base body 2 that is an aluminum oxide ($Al_2O_3$)-based sintered body, a powder such as silica ($SiO_2$) powder, magnesia (MgO) powder, or calcia (CaO) powder is added as a sintering aid to $Al_2O_3$ powder, and a suitable binder, solvent, and plasticizer are further added, and the mixture is kneaded to form a slurry. Then, a molding method such as a doctor blade method or a calender roll method is performed to thereby yield the multipiece ceramic green sheets.

Note that when the base body 2 is formed from a resin, for example, the base body 2 can be formed by a transfer molding method, an injection molding method, or by pressure molding with a metal mold or the like, by using a metal mold that can be used to mold a predetermined shape. In addition, the base body 2 may be formed by impregnating a base material formed of glass fibers with a resin, such as a glass epoxy resin. In this case, the base body 2 can be formed by impregnating a base material formed of glass fibers with an epoxy resin precursor and thermally curing the epoxy resin precursor at a predetermined temperature.

(2) Next, the aforementioned green sheets may be fabricated by using a metal mold or the like. Here, opening portions are formed in the first frame body 2b and the second frame body 2c. In addition, when the base body 2 has notches or the like, the notches or the like may be similarly formed at predetermined locations on the green sheets serving as the base body 2. In addition, in this step, a through hole serving as the channel 6 may be formed in a green sheet to be the first frame body 2b or the second frame body 2c by using a metal mold, a laser, or the like.

(3) Next, the ceramic green sheets that will become respective insulating layers of the base body 2 are stacked and compressed. Thus, the green sheets that will become the respective insulating layers may be stacked to produce a ceramic green sheet layered body to be the base body 2 (the electronic element mounting substrate 1). Note that portions such as cutout sections may be appropriately produced at this time by using a metal mold or the like.

(4) Next, a metal paste is applied to or made to fill portions that are to be the electrode pads 3, the external circuit connection electrodes, the internal wiring electrical conductors, and the internal through conductors in the ceramic green sheets or the ceramic green sheet layered body obtained in steps (1) to (3) above by a screen printing method or the like. This metal paste is created so as to have an appropriate viscosity by adding a suitable solvent and binder to a metal powder formed of the above-described metal materials, and kneading the mixture. Note that glass or ceramic may also be included in the metal paste in order to increase the bonding strength with the base body 2.

In addition, when the base body 2 is made of a resin, the electrode pads 3, the external circuit connection electrodes, the internal wiring electrical conductors, and the through conductors can be made by a sputtering method, a vapor deposition method, or the like. In addition, the above may be made by a plating method after a metal film has been provided on the surfaces of each component.

(5) Next, split grooves may be provided at predetermined positions on the green sheets by using a metal mold, punching, a laser, or the like. The split grooves can be formed by forming cuts in the multipiece wiring board at a depth less than the thickness of the multipiece wiring board using a slicing device after the firing. Alternatively, the split grooves may be formed by pressing a cutter blade against the ceramic green sheet layered body used as the multipiece wiring board, or by forming cuts using a slicing device at a depth less than the thickness of the ceramic green sheet layered body.

(6) Next, the ceramic green sheet layered body is fired at a temperature of approximately from 1500° C. to 1800° C. to obtain a multipiece wiring board on which a plurality of the base bodies 2 (electronic element mounting substrates 1) are disposed. Note that, through this step, the above-described metal paste is fired at the same time as the ceramic green sheets forming the base body 2 (electronic element mounting substrate 1), thus forming the electrode pads 3, the external circuit connection electrodes, the internal wiring electrical conductors, and the through conductors.

(7) Next, the multipiece wiring board obtained by the firing is divided into a plurality of the base bodies 2 (electronic element mounting substrates 1). In this division, a method can be used in which split grooves are formed in advance in step (5) in the multipiece wiring board along locations that will serve as the outer edges of the base bodies 2 (electronic element mounting substrates 1), and the multipiece wiring board is then divided along those split grooves. In addition, there is also a method of cutting along locations that will serve as the outer edges of the base bodies 2 (electronic element mounting substrates 1) by a slicing method or the like without performing step (5). Note that plating may be applied to each of the electrode pads 3, the external connection pads, and the exposed wiring conductors by using an electrolytic or electroless plating method before or after division of the above-mentioned multipiece wiring board into the plurality of base bodies 2 (electronic element mounting substrates 1).

(8) Next, the electronic element 10 is mounted on the electronic element mounting substrate 1. The electronic element 10 is electrically connected to the electronic element mounting substrate 1 by the wires 13. At this time, an adhesive or the like may be provided on the electronic element 10 or the electronic element mounting substrate 1 to affix the electronic element 10 to the electronic element mounting substrate 1. Further, after the electronic element 10 has been mounted on the electronic element mounting substrate 1, the lid 12 may be bonded with the lid bonding member 14. At this time, after bonding of the lid 12, appropriately selected air may be injected into or discharged from the inside of the electronic device 20 using the channel 6.

The electronic device 20 can be produced by producing the electronic element mounting substrate 1 as described in steps (1) to (7) above and mounting the electronic element 10. Note that the order of the above-described steps (1) to (8) is not prescribed as long as the electronic device 20 can be fabricated. In addition to the steps described above, a 3D printer or the like, for example, can be used to manufacture the electronic device 20.

Second Embodiment

An electronic element mounting substrate 1 and an electronic device 20 provided with the electronic element mounting substrate 1 according to a second embodiment of the present disclosure will be described with reference to FIGS. 2 and 3. Note that in the present embodiment, the electronic device 20 is illustrated in FIGS. 2 and 3.

The electronic element mounting substrate 1 includes a substrate 2a having, on an upper surface, a mounting region 4 in which an electronic element 10 is to be mounted. The electronic element mounting substrate 1 includes, on a first upper surface 21 of the substrate 2a, a first frame body 2b located so as to surround the mounting region 4. The electronic element mounting substrate 1 includes electrode pads 3 located on the first upper surface 21 of the substrate 2a or a second upper surface 22 of the first frame body 2b. The electronic element mounting substrate 1 includes, on the second upper surface 22 of the first frame body 2b, a second frame body 2c located so as to surround the electrode pads 3 and the mounting region 4. The second frame body 2c includes a channel 6 extending through the second frame body 2c outward from an inner wall of the second frame body 2c above the electrode pads 3.

In this embodiment, the structure of the electronic module 31, the structure of the electronic device 20, the base body 2 (substrate 2a, first frame body 2b, second frame body 2c) that constitutes the electronic element mounting substrate 1, the material/film of the electrode pads 3, the electronic element 10, and other basic materials/conditions/configurations of the base body 2 are similar to those of the first embodiment, and thus descriptions thereof will be omitted. Features of the second embodiment will be described below.

The electronic element mounting substrate 1 includes the electrode pads 3 located on the first upper surface 21 of the substrate 2a or the second upper surface 22 of the first frame body 2b. In the electronic element mounting substrate 1, the electrode pads 3 may be located on the upper surface of a first frame section 2a as in the example illustrated in FIG. 2, or may be located on the first upper surface 21 of the substrate 2a as in the example illustrated in FIG. 3. In the electronic element mounting substrate 1, by positioning the electrode pads 3 on the upper surface of the first frame section 2a as in the example illustrated in FIG. 2, the position of the upper surface of the electronic element 10 mounted in the mounting region 4 and the positions of the electrode pads 3 in a cross-sectional view can be set to the same height position. In addition, by positioning the electronic element mounting substrate 1 on the first upper surface 21 of the substrate 2a as in the example illustrated in FIG. 3, the structure of the base body 2 is simplified, the yield can be improved, the height of the wires 13 can be kept low, and the electronic element mounting substrate 1 can have a low profile.

The electronic element mounting substrate 1 includes, on the second upper surface 22 of the first frame body 2b, a second frame body 2c located so as to surround the electrode pads 3 and the mounting region 4. Here, when the electrode pads 3 are located on the second upper surface 22 of the first frame body 2b, the second frame body 2c is located outward of the inner edge of the first frame body 2b when viewed from directly above, as illustrated in FIG. 2. In addition, when the electrode pads 3 are located on the first upper surface 21 of the substrate 2a, the inner edge of the second frame body 2c may be located at a position overlapping the inner edge of the first frame body 2b when viewed from directly above as illustrated in FIG. 3, or the inner edge of the second frame body 2c may be located further inward than the inner edge of the first frame body 2b when viewed from directly above.

In the electronic element mounting substrate 1, the second frame body 2c includes, above the electrode pads 3, a channel 6 extending through the second frame body 2c outward from the inner wall of the second frame body 2c.

After manufacture of an electronic device in which an electronic element is mounted in the recessed portion of the electronic element mounting substrate and sealed with a lid or the like, air injection/discharge may be performed from the channel in order to replace the air inside the electronic device with an appropriately selected base such as nitrogen. In recent years, the terminals of electronic elements have become progressively finer, and the diameters of wires used to electrically connect an electronic element and an electronic element mounting substrate to each other have also become smaller. As a result, there has been a concern that the force of air in the step of air injection/discharge using the channel of the electronic device may bend the wires, causing a short circuit between adjacent wires. In addition, there has been a concern that the bonding strength between the wires and the electrode pads of the electronic element mounting substrate may deteriorate due to pressure of the air in the step of air injection/discharge.

In contrast, in the present embodiment, the electronic element mounting substrate 1 includes the electrode pads 3 and the channel 6, where the electrode pads 3 are located on the substrate 2a or the second upper surface 22 of the first frame body 2b and the channel 6 extends through the second frame body 2c outward from the inner wall of the second frame body 2c. In other words, one end of an opening portion of the channel 6 is located above the electrode pads 3 in a cross-sectional view. Consequently, in the step of air injection/discharge using the channel 6, it is possible to reduce the impingement of air directly on the wires 13 or to reduce the area of the air impinging on the wires 13. Therefore, it is possible to reduce bending of the wires 13 due to the force of air and to reduce the occurrence of a short circuit between adjacent wires. Therefore, it is possible to reduce a decrease in the yield of the electronic device 20. Furthermore, the structure of the present embodiment allows stress to be reduced at bonded parts between the electrode pads 3 and the wires 13. Thus, it is possible to mitigate a reduction in bonding strength between the electrode pads 3 and the wires 13 due to stress caused by the air.

In addition to the case where air injection/discharge is performed through the channel, there is a case where only air discharge is performed through the channel such that water vapor or the like does not accumulate inside the electronic device (air injection/discharge is not intentionally performed) in the step of bonding the lid or the like at the time of producing the electronic device. In this step, because air is not intentionally discharged, for example, when the channel is in the same location as or near the electrodes and dust or the like has entered from the channel, the next step will be reached while the dust remains located near the electrodes. Thereafter, in a case where the electronic device is mounted on an external device and then vibration or the like is applied to the electronic device from the outside, there is a concern that dust located near the electrodes may move and cause a short circuit between the electrodes, thereby causing a malfunction.

In contrast, in the present embodiment, since one end of the opening portion of the channel 6 is located above the electrode pads 3 in a cross-sectional view, dust that has entered from the channel 6 is less likely to adhere near the electrode pads 3. Thus, even when the electronic device 20 is subjected to vibration from the outside, it is possible to reduce the likelihood of dust adhering between a plurality of the electrode pads 3 and causing a short circuit between the plurality of electrode pads 3. Therefore, it is possible to reduce the likelihood of malfunction of the electronic device 20.

The electrode pads 3 of the electronic element mounting substrate 1 are located further inward than the second frame body 2c, and the mounting region 4 is located further inward than the electrode pads 3. In other words, the electrode pads 3 of the electronic element mounting substrate 1 and the electronic element 10 mounted in the mounting region 4 do not overlap in a top surface view, and, furthermore, the electrode pads 3 are located on the second upper surface 22 of the first frame body 2b. Consequently, it is possible to position an end portion of the channel 6 above the electrode pads 3 and, in a top surface view, further inward than end portions of the electrode pads 3. In the electronic element mounting substrate 1, by positioning the electrode pads 3 on the upper surface of the first frame section 2a as in the example illustrated in FIG. 2, the position of the upper surface of the electronic element 10 mounted in the mounting region 4 and the positions of the electrode pads 3 in a cross-sectional view can be set to the same height position. Furthermore, since the length of the wires 13 is short, it is possible to reduce the amount of bending of the wires 13 in the step of air injection/discharge using the channel 6. Therefore, it is possible to reduce contact between the wires 13 of adjacent ones of the electrode pads 3 and to improve the effect of the present embodiment.

In addition, by positioning the electronic element mounting substrate 1 on the first upper surface 21 of the substrate 2a as in the example illustrated in FIG. 3, the structure of the base body 2 is simplified, the yield can be improved, the height of the wires 13 can be kept low, and the electronic element mounting substrate 1 can have a low profile. Furthermore, since it possible to keep the height of the wires 13 low, it is possible to reduce the area of a portion where the channel 6 and the wires 13 are at the same height in a cross-sectional view. Therefore, in the injection/discharge of air, it is possible to reduce the area of air directly impinging upon the wires 13, and it is possible to further improve the effect of the present embodiment.

The second frame body 2c of the electronic element mounting substrate 1 includes a plurality of layers, and the channel 6 may be located at least above the first layer from the bottom among the plurality of layers. Consequently, it is possible to increase the distance from the electrode pads 3 in a cross-sectional view. Thus, in the step of air injection/discharge using the channel 6, it is possible to reduce the impingement of air directly on the wires 13 or to reduce the area of the air impinging on the wires 13. Therefore, the effect of the present embodiment can be further improved.

The second frame body 2c of the electronic element mounting substrate 1 includes a plurality of layers, and, in a cross-sectional view, the thickness of the channel 6 may be at least that of one of the plurality of layers. Consequently, air can be injected/discharged more smoothly. Therefore, since it is possible to perform air injection/discharge without increasing output, it is possible to reduce the amount of bending of the wires 13 and, in addition, it is possible to reduce the likelihood of contamination by dust.

Manufacturing Method for Electronic Element Mounting Substrate and Electronic Device Next, an example of a manufacturing method for the electronic element mounting substrate 1 and the electronic device 20 according to the present embodiment will be described. The manufacturing method for the electronic element mounting substrate 1 and the electronic device 20 according to the present embodiment is basically similar to the manufacturing method described in the first embodiment. As a manufacturing method for the electronic element mounting substrate 1 according to the present embodiment, it is possible to produce the electronic element mounting substrate 1 by changing the location at which the electrode pads 3 are provided and the location where the channel 6 is formed in the steps described in the first embodiment.

Third Embodiment

Figure 4B:
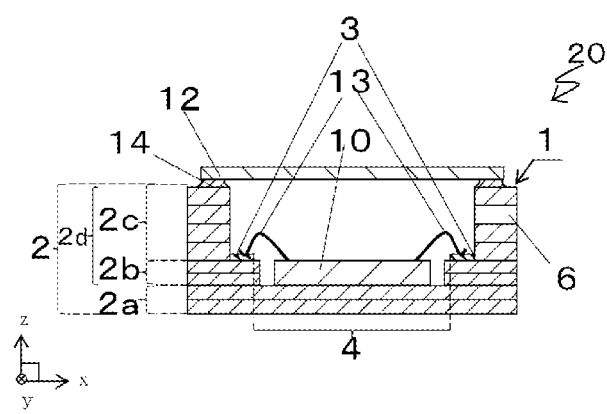
FIG. 4B is a vertical cross-sectional view corresponding to the line X4-4 in FIG. 4A.

An electronic element mounting substrate 1 and an electronic device 20 provided with the electronic element mounting substrate 1 according to a third embodiment of the present disclosure will be described with reference to FIG. 4. Note that in the present embodiment, FIG. 4 illustrates the electronic device 20.

The electronic device 20 includes the electronic element mounting substrate 1 and an electronic element 10 mounted in a mounting region 4 of the electronic element mounting substrate 1 and electrically connected to electrode pads 3 via wires 13. The electronic element mounting substrate 1 includes a substrate 2a having, on an upper surface, the mounting region 4 in which the electronic element 10 is to be mounted. The electronic element mounting substrate 1 includes a first frame body 2b including the electrode pads 3 on an upper surface thereof, the first frame body 2b being located on a first upper surface 21 of the substrate 2a so as to surround the mounting region 4. The electronic element mounting substrate 1 includes a second frame body 2c located on a second upper surface 22 of the first frame body 2b so as to surround the electrode pads 3 and the mounting region 4. The electronic element mounting substrate 1 includes a channel 6 extending through the electronic element mounting substrate 1 outward from an inner wall of the electronic element mounting substrate 1 at a position where the channel 6 does not overlap the wires 13 when viewed from the side.

Here, a base body 2 (substrate 2a, first frame body 2b, second frame body 2c) that constitutes the electronic element mounting substrate 1, the material/film of the electrode pads 3, the electronic element 10, and other basic materials/conditions/configurations of the base body 2 are similar to those of the first embodiment, and thus descriptions thereof will be omitted. Features of the third embodiment will be described below.

The electronic device 20 includes the channel 6 extending through the electronic element mounting substrate 1 outward from the inner wall of the electronic element mounting substrate 1 at a position where the channel 6 does not overlap the wires 13 in a side view.

The electronic device may perform air injection/discharge from the channel to replace the air inside the electronic device with an appropriately selected base such as nitrogen. In recent years, the terminals of electronic elements have become progressively finer, and the diameters of wires used to electrically connect an electronic element and an electronic element mounting substrate to each other have also become smaller. As a result, there has been a concern that the force of air in the step of air injection/discharge using the channel of the electronic device may bend the wires, causing a short circuit between adjacent wires. In addition, there has been a concern that the bonding strength between the wires and the electrode pads of the electronic element mounting substrate may deteriorate due to pressure of the air in the step of air injection/discharge.

In contrast, in the present embodiment, the electronic element mounting substrate 1 includes, in the inner wall of the electronic element mounting substrate 1, the channel 6 that extends through the electronic element mounting substrate 1 outward from the inner wall and that does not overlap the wires 13 in a side view. Consequently, in the step of air injection/discharge using the channel 6, it is possible to reduce the impingement of air directly on the wires 13. Therefore, it is possible to reduce bending of the wires 13 due to the force of air and the occurrence of a short circuit between adjacent wires, and thus reduce a decrease in the yield of the electronic device 20. Furthermore, the structure of the present embodiment allows stress to be reduced at bonded parts between the electrode pads 3 and the wires 13. Thus, it is possible to mitigate a reduction in bonding strength between the electrode pads 3 and the wires 13 due to stress caused by the air. In addition, it is possible to reduce the likelihood of dust, which has entered from the channel 6, being located between a plurality of the electrode pads 3 and causing a short circuit, and, consequently, it is possible to reduce the likelihood of malfunction of the electronic device 20.

In this embodiment, after the step of air injection/discharge or bonding of a lid 12 has been completed, the channel 6 may be filled with a resin or the like at an end portion of the channel 6 located on the outside. Consequently, it is possible to reduce contamination by dust from the channel after the step of air injection/discharge or bonding of the lid 12 has been completed. At this time, applying a metal layer to the inner wall of the channel 6 makes it possible to perform sealing by using, for example, a brazing material.

In addition, the channel 6 may also be opened after the step of producing the electronic device 20. With this configuration, at the stage where the electronic device 20 is connected to an external device and actually used by a user, it is possible to adjust an amount of water inside the electronic device 20 caused by, for example, fluctuations in atmospheric pressure or temperature.

Manufacturing Method for Electronic Element Mounting Substrate and Electronic Device Next, an example of a manufacturing method for the electronic element mounting substrate 1 and the electronic device 20 according to the present embodiment will be described. The manufacturing method for the electronic element mounting substrate 1 and the electronic device 20 according to the present embodiment is basically similar to the manufacturing method described in the first embodiment. As a manufacturing method for the electronic element mounting substrate 1 according to the present embodiment, it is possible to produce the electronic element mounting substrate 1 by changing the location where the portion to be the channel 6 is produced in the steps described in the first embodiment. Alternatively, in the step of mounting the electronic element 10 according to the first embodiment, it is possible to produce the electronic element mounting substrate 1 by adjusting the height of the wires 13 so as to not overlap the channel 6 in a side view.

Fourth Embodiment

An electronic device 20 and an electronic element mounting substrate 1 according to a fourth embodiment of the present disclosure will be described with reference to FIGS. 5 to 9. Note that the fourth embodiment can be expanded to any of the first to third embodiments described above, and the respective configurations can be combined in each embodiment as long as no contradictions arise.

The electronic element mounting substrate 1 according to the present embodiment differs from the electronic element mounting substrate 1 according to the first to third embodiments in that electrode pads 3 and a channel 6 are located so as not to overlap each other in a plane perspective, and in that the channel 6 has a bent shape in a plane perspective.

Figure 5:
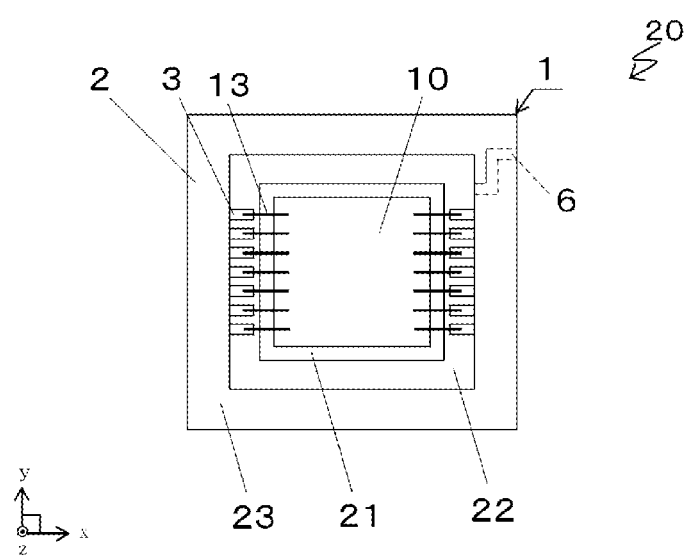
FIG. 5 is a top view illustrating the outer appearance of an electronic element mounting substrate and an electronic device according to an aspect of a fourth embodiment of the present disclosure.
Figure 6A:
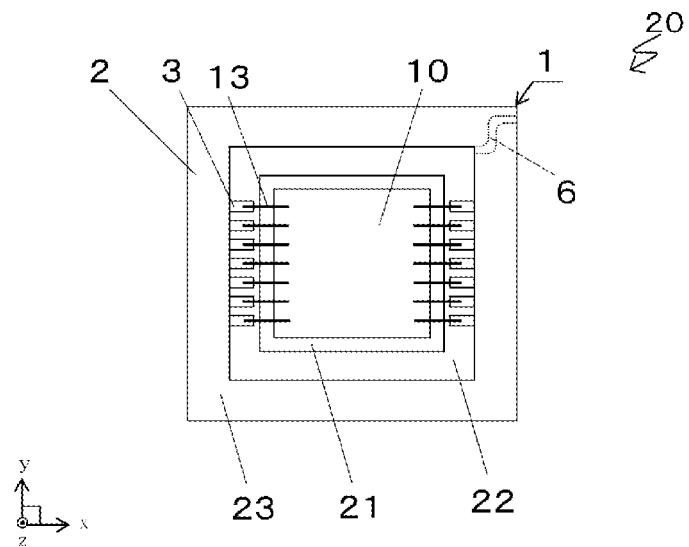
FIGS. 6A and 6B are top views illustrating the outer appearance of an electronic element mounting substrate and an electronic device according to another aspect of the fourth embodiment of the present disclosure, where the lid of the electronic device is omitted.
Figure 6B:
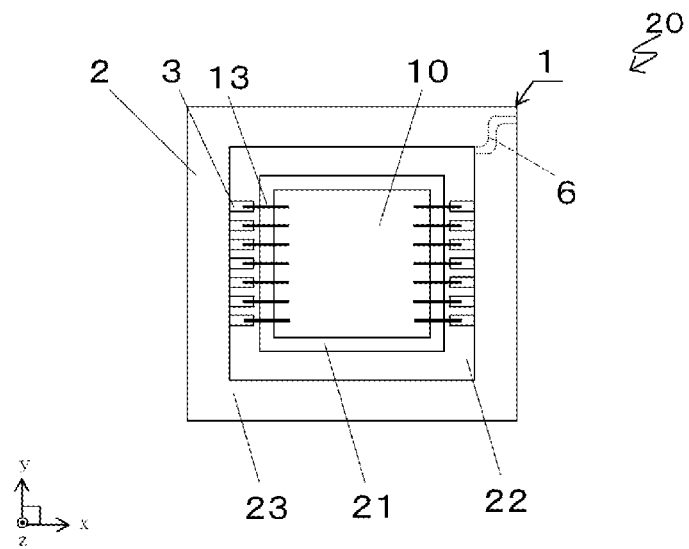

In the examples illustrated in FIGS. 5 and 6, the electrode pads 3 and the channel 6 do not overlap. In other words, the electrode pads 3 are not located near (on a virtual vertical line of) one end of the channel 6. Even with such a configuration, the effect of the present disclosure can be achieved, and, in the step of air injection/discharge through the channel 6, it is possible to reduce the likelihood of adjacent wires 13 coming into contact with each other and causing a short circuit, and it is possible to reduce the likelihood of dust, which has entered from the channel 6, being located between a plurality of the electrode pads 3 and causing a short circuit. Thus, it is possible to reduce the likelihood of malfunction of the electronic device 20 while improving the yield of the electronic element mounting substrate 1. In addition, as in the examples illustrated in FIGS. 5 and 6, in a structure where the electrode pads 3 are not located near (on a virtual vertical line of) one end of the channel 6, even if dust enters from the channel 6, it is possible to reduce the likelihood of dust adhering to the electrode pads 3 and causing a short circuit between a plurality of the electrode pads 3 because the one end of the channel 6 is located away from the electrode pads 3. Therefore, the effect of the present disclosure can be further improved. In addition, in a structure where the electrode pads 3 are not located near (on a virtual vertical line of) one end of the channel 6, it is possible to reduce the impingement of air on the electrode pads 3 at the time of air injection/discharge. Consequently, it is possible to reduce the likelihood of the surface of the electrode pads 3 being scratched by fine dust contained in the air and the plating film coating the surface being peeled off. Thus, it is possible to reduce deterioration and corrosion of the electrode pads 3 from a location where the plating film has peeled off.

Figure 9A:
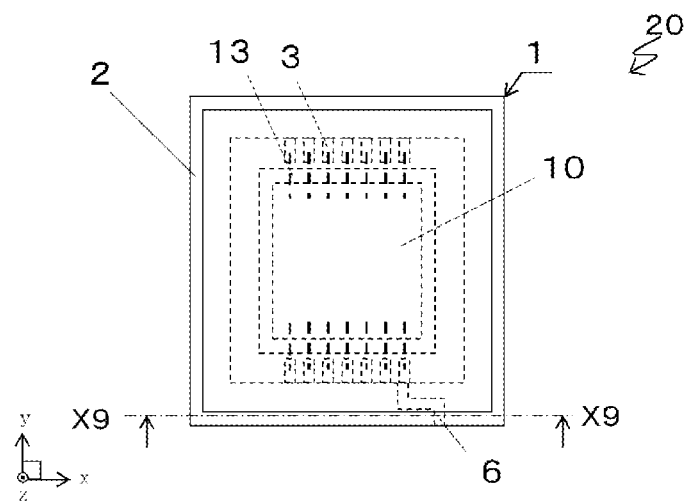
FIG. 9A is a top view illustrating the outer appearance of an electronic element mounting substrate and an electronic device according to another aspect of the fourth embodiment of the present disclosure.
Figure 9B:
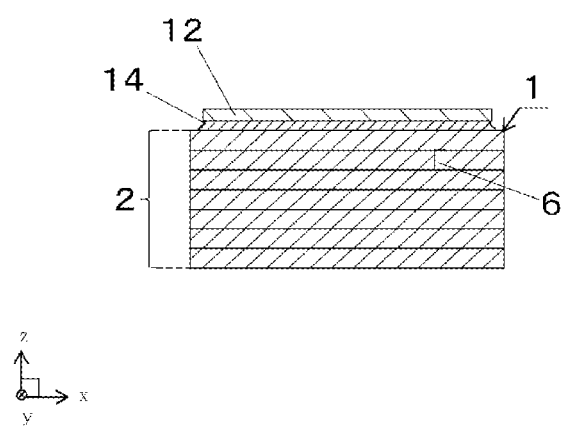
FIG. 9B is a vertical cross-sectional view corresponding to the line X9-X9 in FIG. 9A.

In the example illustrated in FIG. 6, the channel 6 has a bent shape in a plane perspective, and the bent portion has a curved surface. In addition, FIGS. 7 to 9 are reference diagrams of cross-sectional views of sections where the channel 6 has a bent shape. With this configuration, even in a case where dust has entered from an outer end portion of the channel 6, dust can become trapped at the bent portion of the channel 6, which makes it possible to reduce the migration of dust to an inner end portion of the channel 6 or to the interior of the electronic device 20. Accordingly, it is possible to reduce the likelihood of dust adhering to the electrode pads 3 or reduce the likelihood of dust adhering between a plurality of the electrode pads 3 and causing a short circuit. Therefore, the effect of the present disclosure can be further improved. In addition, in the example illustrated in FIG. 6, the bent portion of the channel 6 has a curved surface. With this configuration, in the step of air injection/discharge, for example, even if the channel 6 has a bent portion, it is possible to more smoothly inject/discharge air or discharge debris without stagnating debris or the like that flies through the air in the bent portion. Consequently, since it is possible to perform air injection/discharge without increasing output, the amount of bending of the wire 13 can be reduced, and contamination by dust can be reduced. Thus, it is possible to reduce the likelihood of the wires 13 coming into contact with each other and causing a short circuit, and it is possible to reduce the likelihood of dust, which has entered from the channel 6, being located between the plurality of electrode pads 3 and causing a short circuit. In addition, since the bent portion of the channel 6 has a curved surface, for example, when a base body 2 is formed of a ceramic material, it is possible to reduce the occurrence of cracks in ceramic green sheets in the step of producing the channel 6 from ceramic green sheets. Therefore, it is possible to improve the process yield of the electronic element mounting substrate 1. In addition, it is possible to reduce the likelihood that fine cracks generated in the step of producing the base body 2 progresses during use of the electronic device 20, thereby causing migration in the internal wiring and malfunction of the electronic device 20. In addition, since the bent portion of the channel 6 has a curved surface, it is possible to relax stress concentration due to air pressure in the step of air injection/discharge. Therefore, it is possible to reduce the generation of cracks in the base body 2.

Here, the bent portion of the channel 6 in a plane perspective is located at two positions in FIGS. 5 and 6, but may be located at one or three or more positions. By providing three or more bent portions, it is possible to further improve the effect of trapping dust at the bent portions. In addition, by providing one bent portion, it is possible to reduce stress related to the first frame body 2b or the second frame body 2c in the step of producing the channel 6, and it is possible to reduce the generation of fine cracks.

In the example illustrated in FIG. 6, the channel 6 has an end portion at a corner portion of the first frame body 2b or the second frame body 2c in a plane perspective. Even with such a configuration, the effect of the present disclosure can be achieved, and, in the step of air injection/discharge through the channel 6, it is possible to reduce the likelihood of adjacent wires 13 coming into contact with each other and causing a short circuit, and it is possible to reduce the likelihood of dust, which has entered from the channel 6, being located between a plurality of the electrode pads 3 and causing a short circuit. Thus, it is possible to reduce the likelihood of malfunction of the electronic device 20 while improving the yield of the electronic element mounting substrate 1. In addition, for example, when the base body 2 is formed from a ceramic material, it is possible to reduce the generation of cracks in the ceramic green sheets at an end portion of the channel 6 on the first frame body 2b side or the second frame body 2c side in the step of producing the channel 6 from ceramic green sheets. Therefore, it is possible to improve the process yield of the electronic element mounting substrate 1. In addition, it is possible to reduce the likelihood that fine cracks generated in the step of producing the base body 2 progresses during use of the electronic device 20, thereby causing migration in the internal wiring and malfunction of the electronic device 20.

Next, an example of a manufacturing method for the electronic element mounting substrate 1 and the electronic device 20 according to the present embodiment will be described. The manufacturing method for the electronic element mounting substrate 1 and the electronic device 20 of the present embodiment is basically similar to the manufacturing method described in the first to third embodiments. As a manufacturing method for the electronic element mounting substrate 1 of the present embodiment, it is possible to produce the electronic element mounting substrate 1 by changing the shape of the metal mold and the punching position when forming the portion to be the channel 6 in the steps described in the first embodiment.

Fifth Embodiment

An electronic device 20 and an electronic element mounting substrate 1 according to a fifth embodiment of the present disclosure will be described with reference to FIGS. 10 and 11. Note that the fifth embodiment can be expanded to any of the first to third embodiments described above, and the respective configurations can be combined in each embodiment.

The electronic element mounting substrate 1 of the present embodiment differs from the electronic element mounting substrate 1 of the first to third embodiments in that an end portion of a channel 6 is located on a third upper surface 23 of a second frame body 2c, and that the channel 6 has a bent shape in a cross-sectional view.

Figure 10A:
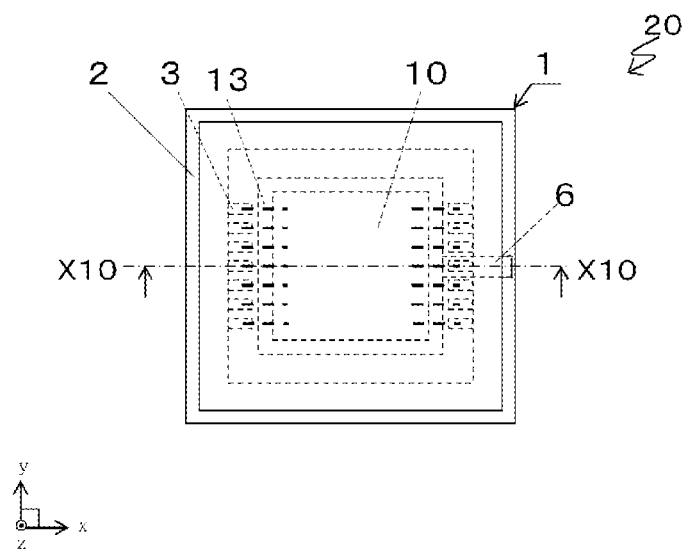
FIG. 10A is a top view illustrating the outer appearance of an electronic element mounting substrate and an electronic device according to an aspect of a fifth embodiment of the present disclosure.
Figure 10B:
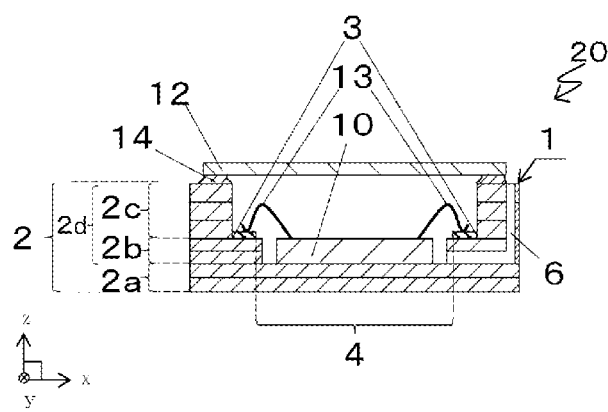
FIG. 10B is a vertical cross-sectional view corresponding to the line X10-X10 in FIG. 10A.
Figure 11A:
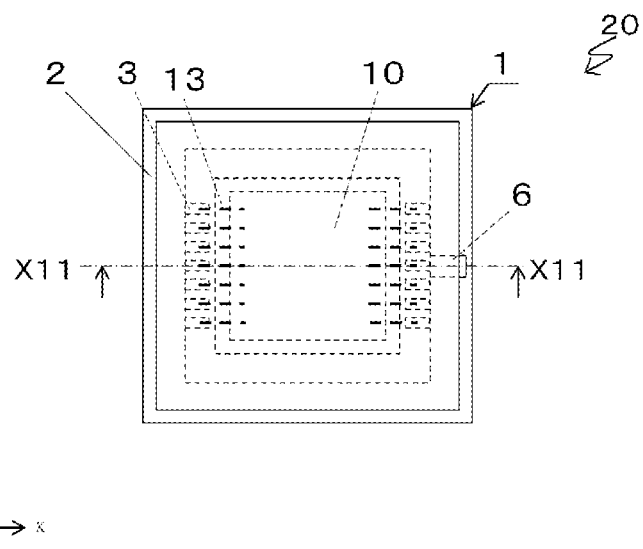
FIG. 11A is a top view illustrating the outer appearance of the electronic element mounting substrate and the electronic device according to the aspect of the fifth embodiment of the present disclosure.
Figure 11B:
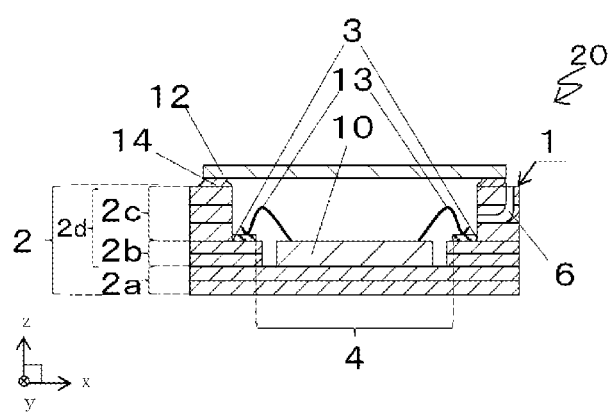
FIG. 11B is a vertical cross-sectional view corresponding to the line X11-X11 in FIG. 11A.

In the example illustrated in FIGS. 10 and 11, the channel 6 is continuous up to the third upper surface 23 of the second frame body 2c. Even with such a configuration, the effect of the present disclosure can be achieved, and, in the step of air injection/discharge through the channel 6, it is possible to reduce the likelihood of adjacent wires 13 coming into contact with each other and causing a short circuit, and it is possible to reduce the likelihood of dust, which has entered from the channel 6, being located between a plurality of electrode pads 3 and causing a short circuit. In addition, since an outer end portion of the channel 6 is continuous up to the third upper surface 23 of the second frame body 2c, air can be injected/discharged and the channel 6 can be sealed in the same step as in the step of bonding a lid 12 in the step of producing the electronic device 20. Thus, the step of producing the electronic device 20 can be simplified. In addition, by simplifying the step, it is possible to reduce the number of times the electronic element mounting substrate 1 or the electronic device 20 is transferred/handled, and it is possible to reduce the occurrence of dust and contamination by dust from the channel 6 during that period. Therefore, the effect of the present disclosure can be further improved.

In the example illustrated in FIG. 11, the channel 6 has a bent shape when viewed in a cross-section, and the bent portion has a curved surface. With this configuration, even in a case where dust has entered from an outer end portion of the channel 6, dust can become trapped at the bent portion of the channel 6, which makes it possible to reduce the migration of dust to an inner end portion of the channel 6 or to the interior of the electronic device 20. Accordingly, it is possible to reduce the likelihood of dust adhering to the electrode pads 3 or reduce the likelihood of dust adhering between a plurality of the electrode pads 3 and causing a short circuit. In addition, the bent portion of the channel 6 has a curved surface. Consequently, for example, in the step of air injection/discharge, even if there is a bent portion, the air at the bent portion does not stagnate even at the portion where the air flow bends, and it is possible to inject/discharge the air more smoothly. Consequently, since it is possible to perform air injection/discharge without increasing the air output, the amount of bending of the wires 13 can be reduced, and contamination by dust can be reduced.

Here, the bent portion of the channel 6 in a cross-sectional view is located at one location in FIGS. 10 and 11, but may be located at two or more. By having two or more bent portions, it is possible to further improve the effect of trapping dust in the bent portions. In addition, the bent portion of the channel 6 may also have a bent portion in plane perspective as in the fourth embodiment, and may have a three-dimensional complex shape. In this case, it is possible to improve the effect of dust trapping.

Next, an example of a manufacturing method for the electronic element mounting substrate 1 and the electronic device 20 according to the present embodiment will be described. The manufacturing method for the electronic element mounting substrate 1 and the electronic device 20 of the present embodiment is basically similar to the manufacturing method described in the first to third embodiments. As a manufacturing method for the electronic element mounting substrate 1 of the present embodiment, it is possible to produce the electronic element mounting substrate 1 by changing the shape of the metal mold and the punching position when forming the portion to be the channel 6 in the steps described in the first embodiment. In addition, the channel 6 that extends in the Z direction can be produced by stacking a plurality of insulating layers of a base body 2 in which each insulating layer of the base body 2 is provided with a through hole by using a metal mold or the like in the same manner as in the step of producing a through conductor, for example. In addition, as a method for producing the base body 2 such as that described above, it is possible to produce the base body 2 more easily by using a 3D printer.

Sixth Embodiment

Figure 12A:
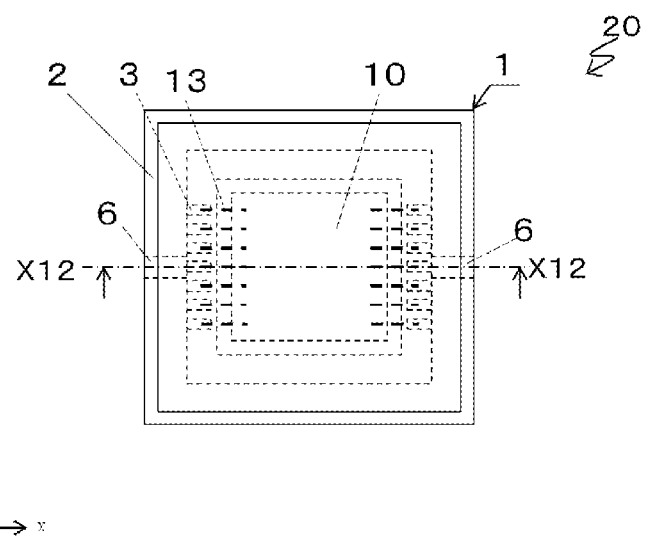
FIG. 12A is a top view illustrating the outer appearance of an electronic element mounting substrate and an electronic device according to an aspect of a sixth embodiment of the present disclosure.
Figure 12B:
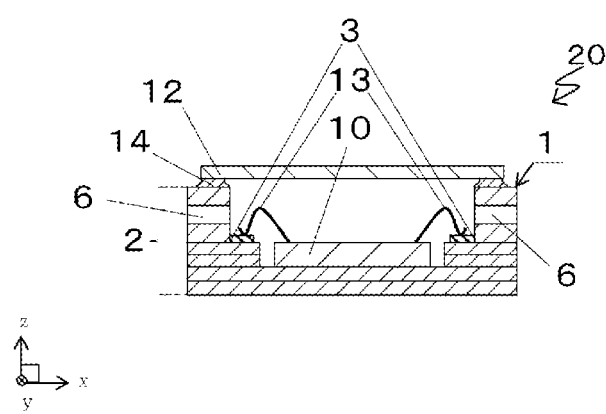
FIG. 12B is a vertical cross-sectional view corresponding to the line X12-X12 in FIG. 12A.
Figure 13A:
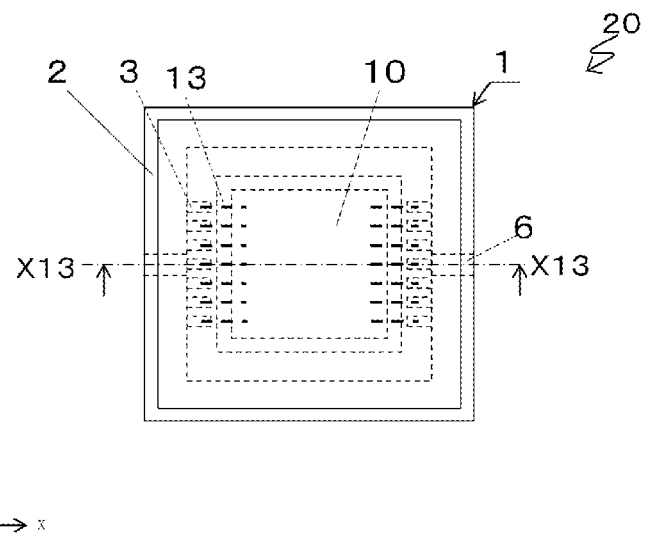
FIG. 13A is a top view illustrating the outer appearance of an electronic element mounting substrate and an electronic device according to another aspect of the sixth embodiment of the present disclosure.
Figure 13B:
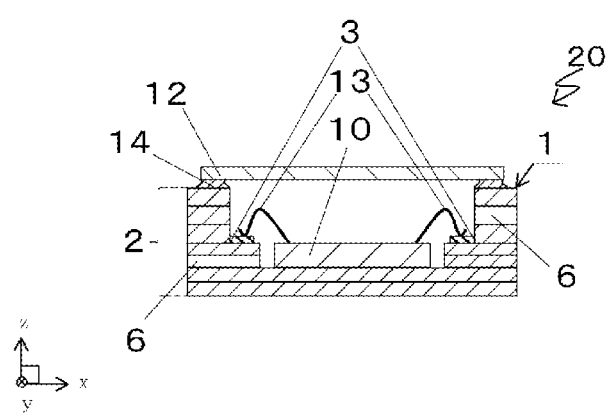
FIG. 13B is a vertical cross-sectional view corresponding to a line X13-X13 in FIG. 13A.

An electronic device 20 and an electronic element mounting substrate 1 according to a sixth embodiment of the present disclosure will be described with reference to FIGS. 12 to 15. Here, FIGS. 12 and 13 illustrate the electronic device 20 according to the present embodiment, and FIGS. 14 and 15 illustrate the electronic element mounting substrate 1 according to the present embodiment. Note that the sixth embodiment can be expanded to any of the first to third embodiments described above, and the respective configurations can be combined in each embodiment.

The electronic element mounting substrate 1 of the present embodiment differs from the electronic element mounting substrate 1 of the first to third embodiments in that there are a plurality of channels 6, that the positions of the plurality of channels 6 in a cross-sectional view differ, and that the shapes of the channels 6 differ.

In the examples illustrated in FIGS. 12 to 15, a plurality of the channels 6 are provided. Even with such a configuration, the effect of the present disclosure can be achieved, and, in the step of air injection/discharge through the channels 6, it is possible to reduce the likelihood of adjacent wires 13 coming into contact with each other and causing a short circuit, and it is possible to reduce the likelihood of dust, which has entered from the channels 6, being located between a plurality of electrode pads 3 and causing a short circuit. Thus, it is possible to reduce the likelihood of malfunction of the electronic device 20 while improving the yield of the electronic element mounting substrate 1. In addition, since the electronic element mounting substrate 1 includes a plurality of the channels 6, for example, air injection/discharge can be performed at once. Therefore, the step of producing the electronic device 20 can be simplified, and it is possible to reduce contamination by dust and the like. In addition, by simplifying the step, it is possible to reduce the number of times the electronic element mounting substrate 1 or the electronic device 20 is transferred/handled/rotated, and it is possible to reduce the occurrence of dust and contamination by dust from the channels 6 during that period. Therefore, the effect of the present disclosure can be further improved.

As in the example shown in FIG. 12, when there are a plurality of the channels 6, the channels 6 may be positioned so as to face each other in plane perspective. In this structure, by increasing the air flow velocity at the time of air injection/discharge, it is possible to decompress the space formed by a lid 12, a substrate 2*a*, a first frame body 2*b*, and a second frame body 2*c*. Therefore, it becomes easy to remove dust in the space formed by the lid 12, the substrate 2*a*, the first frame body 2*b*, and the second frame body 2*c*. Consequently, it is possible to further improve the effect of the present disclosure.

In the example illustrated in FIG. 13, there are a plurality of the channels 6, and the channels 6 differ in height from the lower surface of the substrate 2*a* in a cross-sectional view. Since the plurality of channels 6 differ in height from the lower surface of the substrate 2*a* in a cross-sectional view, for example, at the time of air injection/discharge, by performing air injection through the channel 6 having a high height from the lower surface of the substrate 2*a*, and by performing air discharge through the channel 6 having a low height from the lower surface of the substrate 2*a*, dust mixed in during air injection can be made to drop to at least the first upper surface 21 of the substrate 2*a* by the suction force for discharging air. Therefore, it is possible to reduce the likelihood of dust being located near the electrode pads 3, and it is possible to reduce the likelihood of dust being located between a plurality of the electrode pads 3 and causing a short circuit. Thus, it is possible to reduce the likelihood of malfunction of the electronic device 20 while improving the yield of the electronic element mounting substrate 1.

In addition, in performing air injection/discharge using the channels 6, since the heights of the channels from the lower surface of the substrate 2*a* are different, all of the air from the upper surface to the lower surface of a recessed portion formed by the substrate 2*a*, the first frame body 2*b*, and the second frame body 2*c* can be easily replaced. Consequently, since it is possible to reduce the time required for air injection/discharge without increasing the output of air injection/discharge, the amount of bending of the wires 13 can be reduced and contamination by dust can be reduced. Thus, it is possible to reduce the likelihood of the wires 13 coming into contact with each other and causing a short circuit, and it is possible to reduce the likelihood of dust, which has entered from the channel 6, being located between the plurality of electrode pads 3 and causing a short circuit.

In the examples illustrated in FIGS. 12 and 13, there are a plurality of the channels 6, and the channels 6 have the same shape. With such a configuration, it becomes easy to create an air flow when performing air injection/discharge using the channels 6. Therefore, since it is possible to reduce the time required for air injection/discharge without increasing the output of air injection/discharge, the amount of bending of the wires 13 can be reduced, and contamination by dust can be reduced. Thus, it is possible to reduce the likelihood of the wires 13 coming into contact with each other and causing a short circuit, and it is possible to reduce the likelihood of dust, which has entered from the channel 6, being located between the plurality of electrode pads 3 and causing a short circuit.

FIGS. 14 and 15 illustrate a top view of the electronic element mounting substrate 1.

Figure 14A:
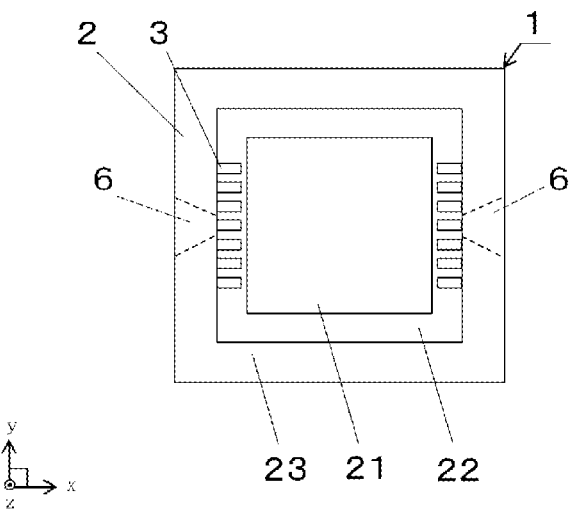
FIGS. 14A and 14B are top views illustrating an electronic element mounting substrate according to another aspect of the sixth embodiment of the present disclosure.
Figure 15A:
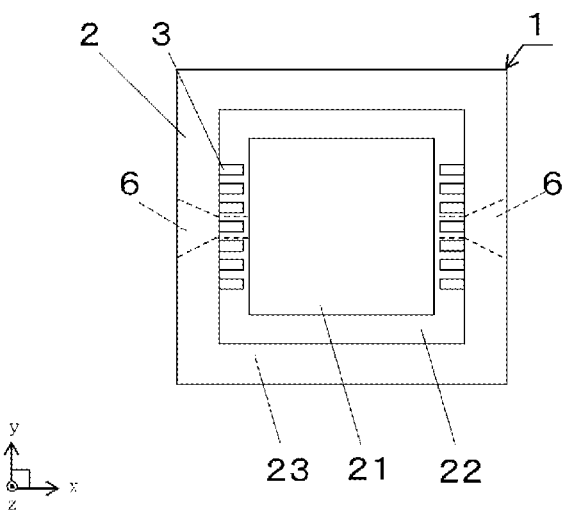
FIGS. 15A and 15B are top views illustrating an electronic element mounting substrate according to another aspect of the sixth embodiment of the present disclosure.
Figure 15B:
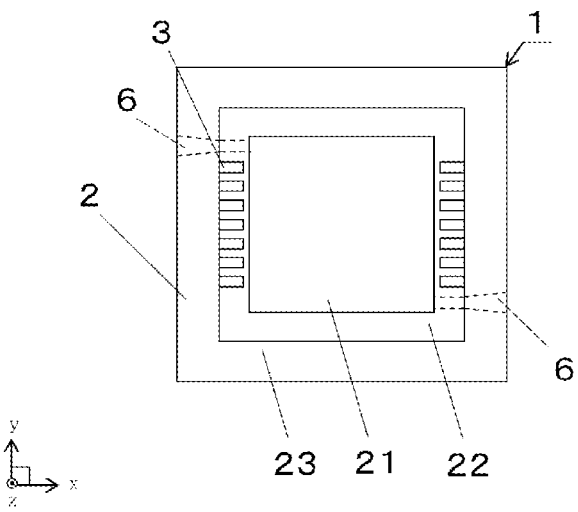

In the examples illustrated in FIGS. 14A and 15, the plurality of channels 6 are larger at an end portion on an outer side than at an end portion on an inner wall side of the first frame body 2*b* or the second frame body 2*c* in a top surface view. With such a configuration, contamination by dust is less likely to occur from the end portion of the channels 6 on the outer side. Therefore, it is possible to reduce the likelihood of dust, which has entered from the channels 6, being located between a plurality of the electrode pads 3 and causing a short circuit. Note that, as in the example illustrated in FIG. 15, when the channels 6 are located between the first frame body 2b and the substrate 2a, the channels 6 may have a linear portion near the inner wall of the first frame body 2b. Consequently, it is possible to further reduce contamination by dust, and it is possible to improve the effect of reducing the likelihood of dust, which has entered from the channel 6, being located between a plurality of the electrode pads 3 and causing a short circuit.

Figure 14B:
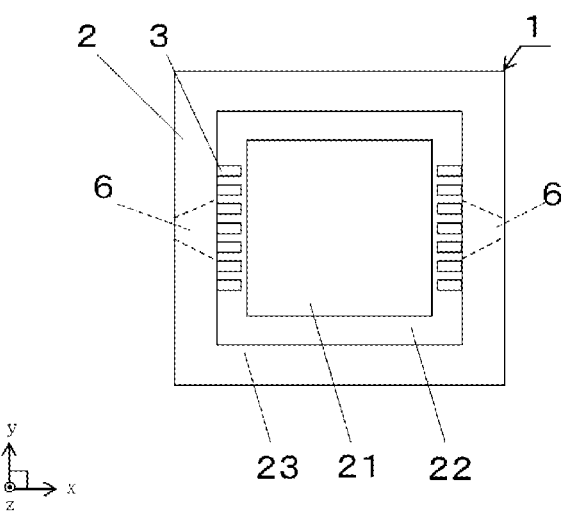

In the example illustrated in FIG. 14B, the plurality of channels 6 are smaller at an end portion on the outer side than at an end portion on the inner wall side of the second frame body 2c in a top surface view. Consequently, it is possible to expand sales of air injected using the channel 6 over a wide range, and it is possible to reduce the momentum of the air around the inner-side end portion of the channel 6. Thus, the amount of bending of the wires 13 can be reduced. Therefore, it is possible to reduce the likelihood of the wires 13 coming into contact with each other and causing a short circuit. Note that, when the channels 6 are located between the first frame body 2b and the substrate 2a, the channels 6 may have a linear portion near the inner wall of the first frame body 2b. Consequently, it is possible to expand sales of air injected using the channels 6 over a wide range, it is possible to reduce the force of air around the inner-side end portion of the channels 6, and, furthermore, it is possible to separate the end portions of the channels 6 from the electrode pads 3. Therefore, it is possible to reduce the amount of bending of the wires 13 and to reduce the likelihood of dust, which has entered from the channels 6, being located between a plurality of the electrode pads 3 and causing a short circuit.

Next, an example of a manufacturing method for the electronic element mounting substrate 1 and the electronic device 20 according to the present embodiment will be described. The manufacturing method for the electronic element mounting substrate 1 and the electronic device 20 of the present embodiment is basically similar to the manufacturing method described in the first to third embodiments. As a manufacturing method for the electronic element mounting substrate 1 of the present embodiment, it is possible to produce the electronic element mounting substrate 1 by changing the shape of the punching metal mold and performing punching in a plurality of places when forming the portion to be the channel 6 in the step described in the first embodiment.

Seventh Embodiment

An electronic element mounting substrate 1 according to a seventh embodiment of the present disclosure will be described with reference to FIG. 16. Note that the seventh embodiment can be expanded to any of the first to third embodiments described above, and the respective configurations can be combined in each embodiment.

The electronic element mounting substrate 1 of the present embodiment and the electronic element mounting substrate 1 of the first to third embodiments differ in that a base body 2 has notches 7 and end portions of channels 6 are located in the respective notches 7.

Figure 16:
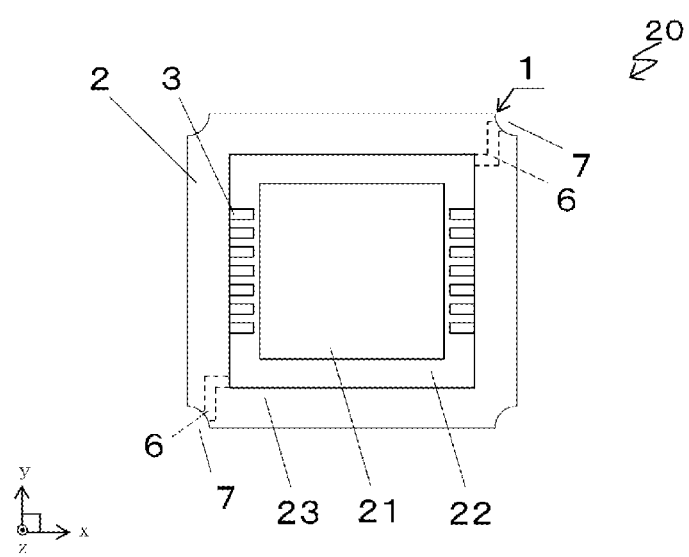
FIG. 16 is a top view illustrating an electronic element mounting substrate according to an aspect of a seventh embodiment of the present disclosure.

In the example illustrated in FIG. 16, in a plane perspective, the corners of a substrate 2a, a first frame body 2b, and a second frame body 2c overlap each other, the corners have the notches 7, and end portions of the channels 6 are located in the respective notches 7. Even with such a configuration, the effect of the present disclosure can be obtained, and, in the step of air injection/discharge in the channels 6, it is possible to reduce the likelihood of adjacent wires 13 coming into contact with each other and causing a short circuit. In addition, it is possible to reduce the likelihood of dust, which has entered from the channels 6, being located between a plurality of electrode pads 3 and causing a short circuit. Thus, it is possible to reduce the likelihood of malfunction of the electronic device 20 while improving the yield of the electronic element mounting substrate 1.

An opening portion of each of the channels 6 needs to have a certain size for air injection/discharge. However, there has been a concern that the opening may become clogged with dust in the step of producing the channel 6 and/or the step of moving the electronic element mounting substrate 1. In addition, there has been a concern that the opening portion may become crushed as a result of equipment, used for moving the electronic element mounting substrate 1, coming into contact with the periphery of the opening portion. In contrast, since an end portion of the channel 6 is located in the notch 7, the notch 7 can have a role of protecting the end portion of the channel 6. Consequently, clogging of the opening of the channel 6 with dust can be reduced. In addition, by the channel 6 being located in an end portion of the notch 7, it is possible to reduce the likelihood of equipment used for moving the electronic element mounting substrate 1 coming into contact with the periphery of the opening portion. Therefore, it is possible to secure the area of the opening of an outer end portion of the channel 6, and it is possible to reduce the likelihood of trouble when performing air injection/discharge using the channel 6.

In the example illustrated in FIG. 16, the notches 7 are located at corners of the base body 2, but the notches 7 may be located at each side of the base body 2. Even in this case, the above-mentioned effect can be obtained because the outer end portions of the channels 6 are located in the respective notches 7.

Note that the present disclosure is not intended to be limited to the examples described in the above-described embodiments, and various modifications are possible such as modification of numerical values. In addition, for example, in the example illustrated in each figure, the shape of the electrode pads 3 is rectangular when viewed from directly above, but the shape may be a circular shape or another polygonal shape. In addition, the arrangement, number, and shape of the electrode pads 3, the mounting method for the electronic element, and the like in the above-described embodiments are not specified. Note that various combinations of characteristic portions of the above-described embodiments are not limited to the examples in the above-described embodiments. In addition, combination of the embodiments is also possible.

REFERENCE SIGNS LIST

1 Electronic element mounting substrate
2 Base body
2a Substrate
2b First frame body
2c Second frame body
2d Frame body
3 Electrode pad
4 Mounting region 6 Channel
7 Notch
10 Electronic element
12 Lid
13 Connection conductor (wire)
14 Frame body connecting member
20 Electronic device
32 Casing
31 Electronic module

The invention claimed is:

1. An electronic element mounting substrate comprising:
a substrate comprising, on a first upper surface, a mounting region in which an electronic element is to be mounted;
a frame body located on the first upper surface of the substrate and surrounding the mounting region;
a channel extending through the frame body outward from an inner wall of the frame body; and
an electrode pad located on the first upper surface of the substrate or an inner surface of the frame body, wherein
the channel is located above or below the electrode pad, and
the frame body comprises a first frame body located on the first upper surface of the substrate and surrounding the mounting region, and a second frame body located on and is in direct contact with a second upper surface of the first frame body and surrounding the mounting region.

2. The electronic element mounting substrate according to claim 1, wherein
the electrode pad is located above the channel located in the inner wall between the substrate and the first frame body, and is located on an upper surface of the first frame body or an inner surface of the second frame body.

3. The electronic element mounting substrate according to claim 1, wherein
the electrode pad is located on an upper surface of the substrate or an inner surface of the first frame body, and
the second frame body comprises a channel extending through the second frame body outward from an inner wall above the electrode pad.

4. The electronic element mounting substrate according to claim 2, wherein
in a plane perspective, the electrode pad is located further inward than the second frame body, and the mounting region is located further inward than the electrode pad.

5. The electronic element mounting substrate according to claim 1, wherein
in a plane perspective, the electrode pad and the channel are located not overlapping each other.

6. The electronic element mounting substrate according to claim 2, wherein
the channel is continuous up to a third upper surface of the second frame body, and the channel located at the third upper surface of the second frame body is located away from the electrode pad in a plane perspective.

7. The electronic element mounting substrate according to claim 1, wherein
a plurality of the channels are provided, and
the plurality of the channels each differ in height from a lower surface of the substrate in a cross-sectional view.

8. The electronic element mounting substrate according to claim 1, wherein
a plurality of the channels are provided, and
the plurality of the channels each have the same shape.

9. The electronic element mounting substrate according to claim 1, wherein
the channel comprises an end portion at a position overlapping a corner portion of the substrate in a plane perspective.

10. The electronic element mounting substrate according to claim 1, wherein
the channel comprises a portion that is bent in a plane perspective and/or a cross-sectional view, and
the portion comprises a curved surface.

11. The electronic element mounting substrate according to claim 2, wherein
in a plane perspective, corner portions of the substrate, the first frame body, and the second frame body overlap each other,
each of the corner portions comprises a notch, and
an end portion of the channel is located in the notch.

12. The electronic element mounting substrate according to claim 3, wherein
the second frame body comprises a plurality of layers, and
the channel is located at least above a first layer from the bottom among the plurality of layers.

13. An electronic device comprising:
an electronic element mounting substrate comprising
a substrate comprising, on a first upper surface, a mounting region in which an electronic element is to be mounted,
a frame body located on the first upper surface of the substrate and surrounding the mounting region, and
an electrode pad located on the first upper surface of the substrate or an inner surface of the frame body; and
an electronic element mounted in the mounting region and electrically connected to the electrode pad via a connection conductor, wherein
the electronic element mounting substrate comprises a channel extending through the electronic element mounting substrate outward from an inner wall that does not overlap the connection conductor in a side view, and
the frame body comprises a first frame body located on the first upper surface and comprising the electrode pad and surrounding the mounting region, and a second frame body located on and is in direct contact with a second upper surface of the first frame body and surrounding the electrode pad and the mounting region.

14. The electronic device according to claim 13, wherein
the channel is continuous up to a third upper surface of the second frame body.

15. The electronic device according to claim 13, wherein
a plurality of the channels are provided, and
the plurality of the channels each differ in height from a lower surface of the substrate in a cross-sectional view.

16. The electronic device according to claim 13, wherein
a plurality of the channels are provided, and
the plurality of the channels each have the same shape.

17. The electronic device according to claim 13, wherein
the channel comprises an end portion at a corner portion of the substrate in a plane perspective.

18. The electronic device according to claim 13, wherein
the channel comprises a portion that is bent in a plane perspective and/or a cross-sectional view, and
the portion comprises a curved surface.

19. The electronic device according to claim 14, wherein
in a plane perspective, corner portions of the substrate, the first frame body, and the second frame body overlap each other, each of the corner portions comprises a notch, and
an end portion of the channel is located in the notch.

20. The electronic element mounting substrate according to claim 1, wherein
the substrate is a layered body, and
the channel extends in a direction perpendicular to a direction in which respective layers of the layered body are stacked.

* * * * *